(12) United States Patent
Thompson (10) Patent No.: US 10,539,602 B2
(45) Date of Patent: Jan. 21, 2020

(54) ACTIVE SHAFT GROUNDING SYSTEM WITH DIAGNOSTIC WAVEFORM ANALYSIS

(71) Applicant: Siemens Energy, Inc., Orlando, FL (US)

(72) Inventor: Edward David Thompson, Casselberry, FL (US)

(73) Assignee: SIEMENS ENERGY, INC., Orlando, FL (US)

(*) Notice: Subject to any disclaimer, the term of this patent is extended or adjusted under 35 U.S.C. 154(b) by 0 days.

(21) Appl. No.: 15/362,875

(22) Filed: Nov. 29, 2016

(65) Prior Publication Data

US 2017/0285086 A1    Oct. 5, 2017

Related U.S. Application Data

(60) Provisional application No. 62/318,737, filed on Apr. 5, 2016.

(51) Int. Cl.
  *G01R 31/02* (2006.01)
  *G01R 31/34* (2006.01)
  *G01R 19/04* (2006.01)

(52) U.S. Cl.
  CPC .......... *G01R 31/025* (2013.01); *G01R 19/04* (2013.01); *G01R 31/34* (2013.01); *G01R 31/343* (2013.01)

(58) Field of Classification Search
  CPC ..... G01R 31/025; G01R 31/34; G01R 31/343
  See application file for complete search history.

(56) References Cited

U.S. PATENT DOCUMENTS

| 4,163,227 A |   | 7/1979 | Sawada et al. |
| 4,851,949 A | * | 7/1989 | Lemak ................. H02H 3/14 324/545 |
| 4,873,512 A |   | 10/1989 | Miller |
| 5,233,499 A |   | 8/1993 | Twerdochlib |
| 5,804,903 A |   | 9/1998 | Fisher et al. |
| 6,091,236 A |   | 7/2000 | Piety et al. |
| 7,034,706 B1 |   | 4/2006 | Nippes |
| 7,649,470 B2 |   | 1/2010 | Hobelsberger et al. |

(Continued)

OTHER PUBLICATIONS

Arabaci et al., "Diagnosis of Broken Rotor Bar Faults by Using Frequency Spectrum of Stator Current Envelope", IEEE (2012): pp. 1643-1646.*

(Continued)

*Primary Examiner* — Michele Fan (57) ABSTRACT

A system that applies a counteracting voltage or current to a rotating shaft to minimize a grounding voltage signal of the shaft, measures and analyzes the counteracting signal, and provides expert system logic that compares prior learned waveforms and models of baseline, fault, and degradation waveforms to operational waveforms to determine and predict faults and degradation events. Self-learning logic analyzes the operational waveforms to look for changes, and finds or predicts fault and degradation events in relation to archived characteristics of earlier waveforms. It then adds characteristics of predictive waveforms to the database of model waveforms, and updates rules and thresholds in the expert logic based on the found predictors. It may further calculate and continuously refine a counteracting signal waveform to minimize the shaft grounding waveform.

14 Claims, 7 Drawing Sheets

(56) References Cited

U.S. PATENT DOCUMENTS

| | | |
|---|---|---|
| 9,046,579 B2 | 6/2015 | Gattermann et al. |
| 9,091,732 B2 | 7/2015 | Higgins |
| 2005/0184751 A1 | 8/2005 | Hobelsberger et al. |
| 2010/0082143 A1* | 4/2010 | Pantaleano ............ G06Q 10/06 700/105 |
| 2011/0313701 A1 | 12/2011 | Higgins |
| 2012/0323372 A1 | 12/2012 | Gattermann et al. |
| 2013/0030765 A1* | 1/2013 | David .................. G05B 23/024 702/183 |
| 2014/0117912 A1* | 5/2014 | Gajic .................. G01R 31/343 318/490 |

OTHER PUBLICATIONS

Gupta et al. "Induction Machine Rotor Faults Diagnostics through Stator Current Using Artificial Neural Network", International Journal of Emerging Trends & Technology in Computer Science (IJETTCS), 3 (Jul.-Aug. 2014): pp. 13-21.*

Rahman et al., "Online Unbalanced Rotor Fault Detection of an IM Drive Based on Both Time and Frequency Domain Analyses", IEEE (2015): pp. 1-8.*

Bessam et al., "DWT and Hilbert Transform for Broken Rotor Bar Fault Diagnosis in Induction Machine at Low Load", Enegy Procedia, 74 (2015): pp. 1248-1257.*

Nippes et al., "Understanding Shaft Voltage and Grounding Currents of Turbine Generators", Magnetic Products and Services, (2005): pp. 1-12. (Year: 2005).*

* cited by examiner

ACTIVE SHAFT GROUNDING SYSTEM WITH DIAGNOSTIC WAVEFORM ANALYSIS

FIELD OF THE INVENTION

The invention relates generally to diagnosing turbine, generator, or motor problems by analyzing a voltage and/or current associated with the shaft, for example a grounding voltage and/or current of the shaft or a counteracting voltage and/or current applied to the shaft. It particularly relates to learning algorithms and automated analysis of voltage and/or current waveforms of the counteracting voltage or current.

BACKGROUND OF THE INVENTION

Electrical potentials can occur in a rotating shaft of turbines, generators, and motors due to a variety of reasons. Potentials can occur due to electrostatic charge buildup from steam or water contact with shaft components and capacitive or inductive coupling from dissymmetries in the stator or field windings, excitation system or equipment problems such as shorts in rotating field components or grounded bearing pedestals in the case on insulated bearings. Electrical potentials on a turbine/generator shaft must be grounded to avoid the voltage building up to high levels that cause problems such as arcs discharging across the oil film in bearings causing damage to surfaces in the bearings and resulting consequential damage. Shaft grounding systems typically connect to the shaft via carbon brushes or copper braids that rub against the rotating shaft. However, a semiconducting film due to dirt and oil can form between the brushes and shaft, reducing grounding effectiveness and allowing the shaft voltage to increase. Routine maintenance is required to clean the shaft and brushes. If maintenance is not performed on time, a poorly grounded shaft can cause a bearing or other component failure and a forced outage. The failure can cascade into consequential damage to seals, other bearings, and turbine blade tips. Damage to hydrogen seals in a generator can result in a hydrogen explosion. Other problems, such as shorts in insulated bearing pedestals or rotor windings can instantly result in very high shaft current, and cause a major outage well short of any maintenance interval.

U.S. Pat. No. 7,034,706 (Nippes) describes sampling the shaft voltage waveform, but only teaches standard electrical signal processing such as average and peak voltage limits and does not evaluate the shape of the waveform. The simple voltage average and peak values may then be used with other operational parameter alarm conditions, such as high bearing temperature, with Boolean logic. This does not make any evaluation of the waveform shape, which is a key indicator of potential problems.

U.S. Pat. No. 9,091,732 (Higgins) describes a shaft monitoring system that notifies a user of a fault condition based upon harmonic content of a voltage signal and electromagnetic interference (EMI) data.

Manual analysis by a human expert with an oscilloscope can analyze the waveform shape. However few people can perform such analysis at a high level of expertise, their time is expensive, and they are constantly learning by experience in the field. This experience is not instantly transferred to other experts. A human expert will typically only evaluate a turbine/generator at the time they are capturing data, so most of the time the system is unmonitored by a waveform shape expert, and a fault or predictive shape change can occur without notice.

U.S. Pat. No. 4,873,512 (Miller) is incorporated herein by reference in its entirety. It describes an active shaft grounding and diagnostic system that provides a counteracting voltage to the shaft of rotating equipment to minimize shaft voltage. Further improvement is needed; to monitor, diagnose, and predict faults; and to identify causes of faults.

BRIEF DESCRIPTION OF THE DRAWINGS

The invention is explained in the following description in view of the drawings that show.

DETAILED DESCRIPTION OF THE INVENTION

Figure 1A:
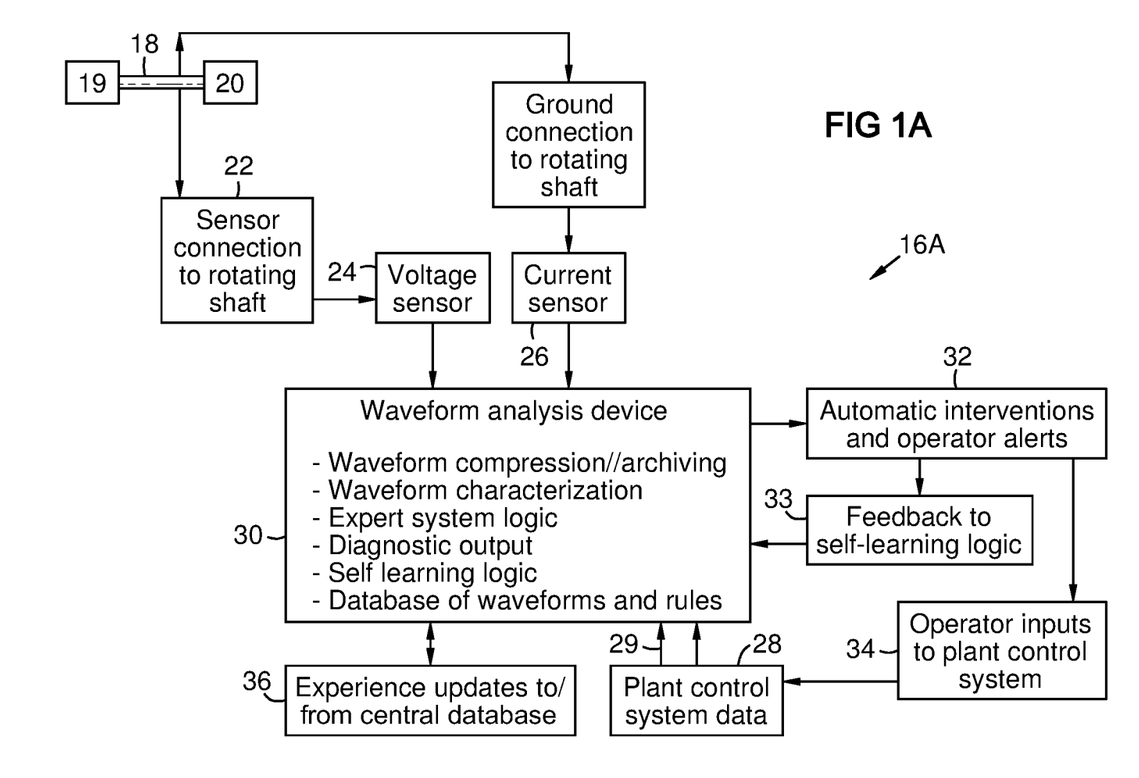
FIG. 1A is a schematic system view of aspects of an embodiment of the invention.

FIG. 1A illustrates aspects of a rotating shaft ground monitoring system 16A according to an embodiment of the invention. An electrical connection 22 is made to a shaft 18 of rotating equipment such as a generator 19, turbine 20, or motor. The connection may take the form of a brush or other device, including a grounding brush. A voltage sensor 24 provides a voltage signal to a waveform analysis device 30. The voltage sensor may provide sampling and analog/digital conversion, or it may condition the signal for such processing in the waveform analysis device. An optional current sensor 26 may provide a current signal to the waveform analysis device 30. The current sensor may provide sampling and analog/digital conversion, or it may condition the signal for such processing in the waveform analysis device. The voltage and current signals may be captured as a time series of data at a sample rate of at least 2 kHz or at least 3 kHz. The waveform analysis device 30 may comprise a processor with random access memory, program logic, and a database of programs, baseline and fault model waveforms, archived grounding waveforms, time series reduced data, data from the operating condition of the monitored equipment transferred from other systems thereof, equipment configuration information, expert system logic, and self-learning logic. "Processor" herein includes one or more interconnected processors comprising the waveform analysis device and interrelated system elements.

Figure 1B:
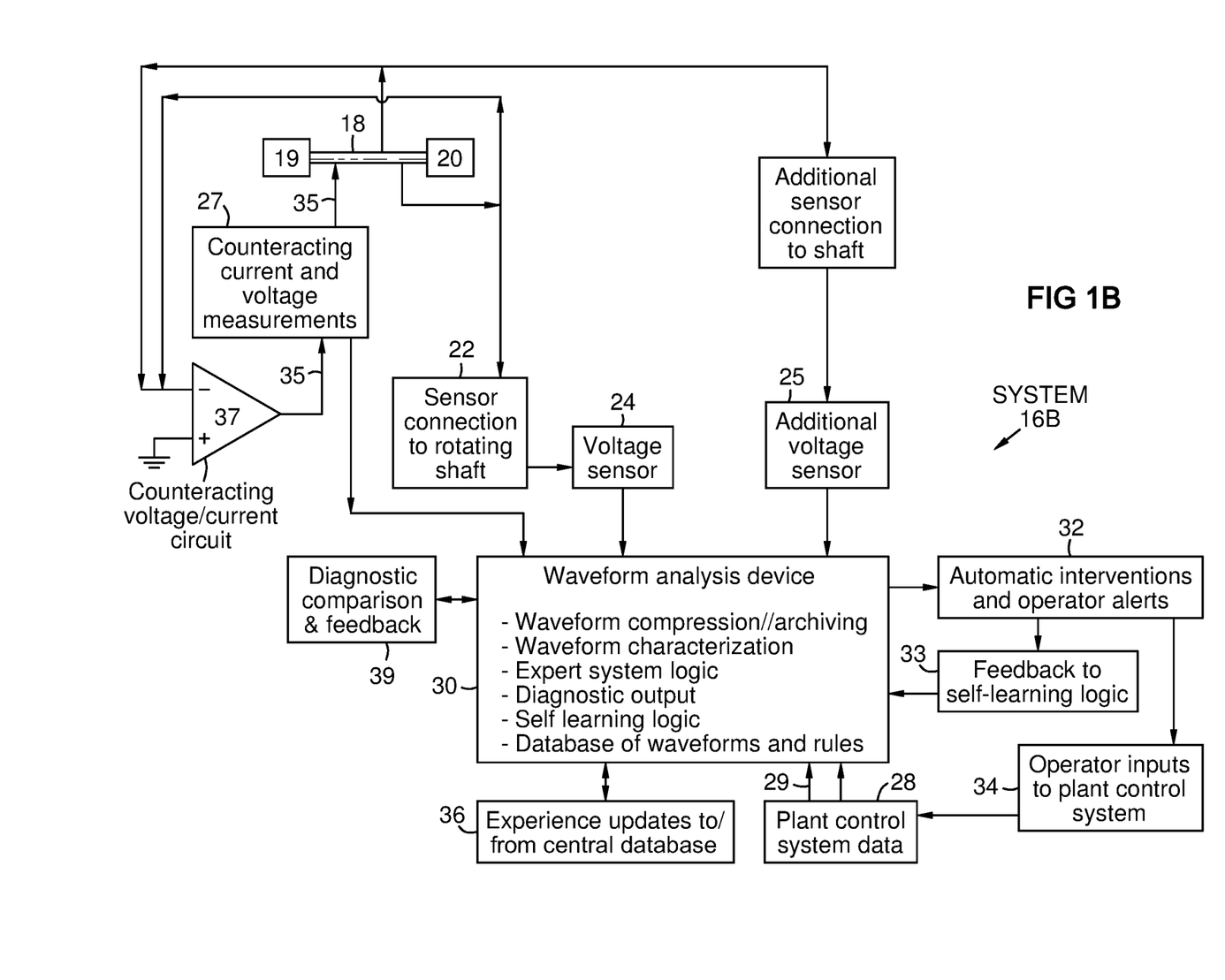
FIG. 1B is a schematic view of aspects of an embodiment of the invention for an active shaft grounding system where a counteracting voltage and/or current is provided by a circuit, and is compared to the shaft voltage and/or current for diagnostic analysis.

FIG. 1B shows aspects of a system embodiment 16B having elements to monitor and diagnose a counteracting voltage and/or current applied to the shaft by an active shaft grounding system to neutralize or minimize the voltage on the shaft. Such counteracting voltage or current may be monitored instead of, or in addition to, monitoring the grounding voltage 24. The counteracting voltage level may be determined and applied 35 to the shaft 18 by an analog circuit 37 such as an op-amp as described for example in U.S. Pat. No. 4,873,512. Electrical element 37 is shown symbolically in the drawing, and is not to be limited by details of the symbol. A diagnostic element 39 may comprise program logic in the waveform analysis device 30 or in an attached device that obtains input from the voltage sensor 24 and from measurements 27 of the counteracting current and voltage. An additional voltage sensor 25 may be connected to the shaft 18 for redundancy.

A "signal" herein represents an electrical voltage or current. The term "grounding waveform" includes waveforms of voltage and/or current signals provided by sensor(s) 24, 25 associated with the shaft 18. A counteracting signal 35 may be received from the component 37 that generates it, rather than being sensed from the shaft. "Grounding voltage or current" and "counteracting voltage or current" herein mean a voltage relative to a reference potential at a ground or chassis of the rotating equipment, or a current associated with such voltage. The term "voltage or current" means "at least one of voltage and current".

Figure 1C:
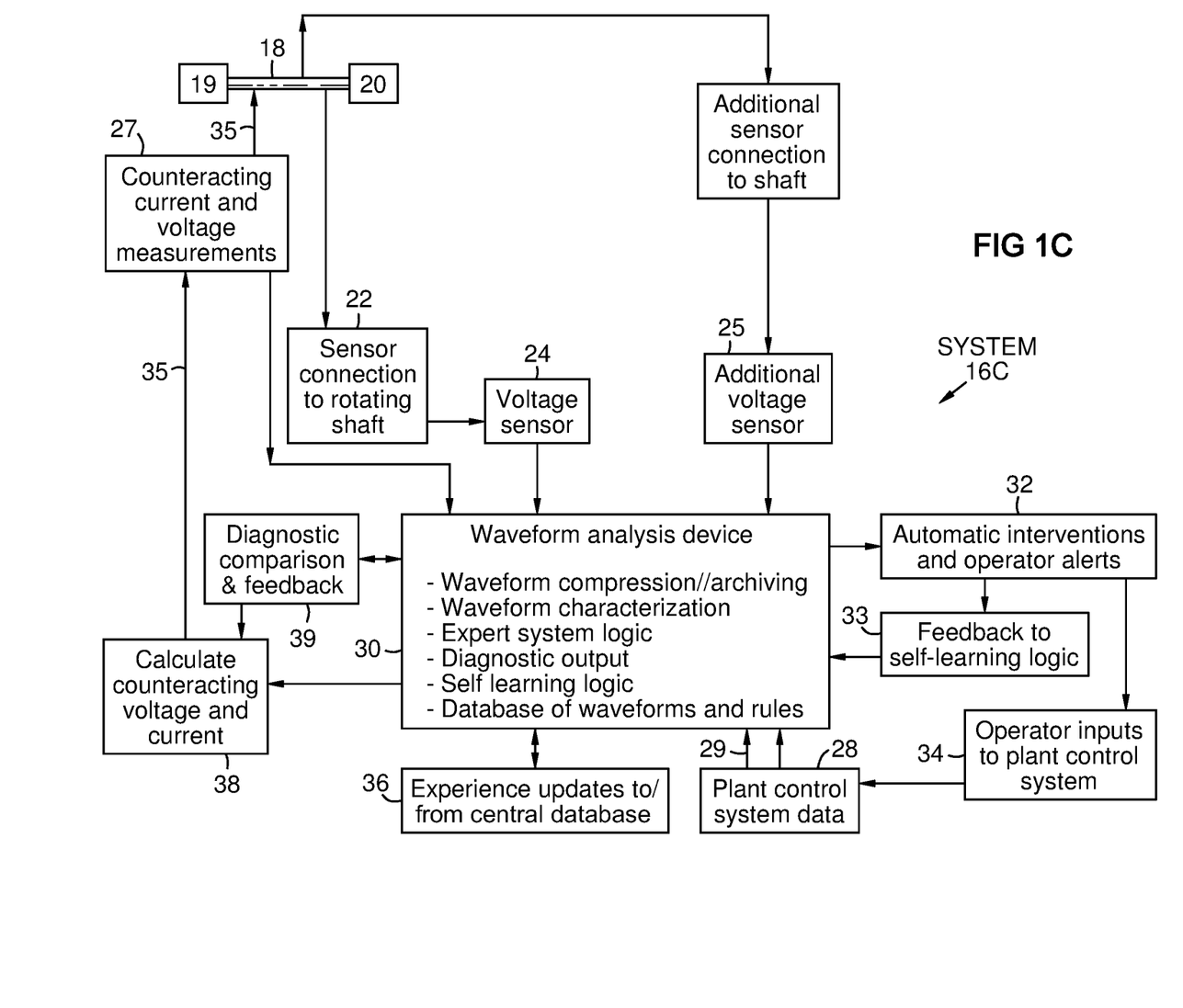
FIG. 1C is a schematic view of aspects of an embodiment of the invention in which a counteracting voltage and/or current waveform is calculated by a processor, and is compared to the shaft voltage and/or current waveform for diagnostic analysis.

FIG. 1C shows aspects of a system embodiment 16C having elements to calculate, apply, monitor, and diagnose a counteracting voltage to neutralize or minimize the shaft voltage. In this embodiment, the counteracting voltage level may be calculated by a device 38 with inputs and output as shown to provide counteracting voltage 35 to the shaft 18. The calculation may be done by logic in the processor of the waveform analysis device 30 or in an attached processor. The counteracting voltage and current may be measured 27 diagnosed 39 and refined as later described. The diagnosing element 39 may comprise program logic in the waveform analysis device or in an attached device that obtains input from a shaft voltage sensor 24 and from measurements 27 the counteracting current and voltage. An additional voltage sensor 25 may be connected to the shaft 18 for redundancy.

Programs may include waveform modeling, for example by Fourier transform, wavelet transform, principal component transform, support vector machine modeling, neural network modeling. "Modeling" and "model" herein refer to a mathematical characterization of a waveform shape of a received signal. A model may also provide data compression. Programs may further include expert logic that uses pre-loaded rules and self-learned rules for analyzing waveform shapes. Programs may further include self-learning logic that finds early changes in waveform shapes that are predictive of later alerts or faults such as high bearing temperature, vibration, or arcing. Plant control system data 28 may be input to the waveform analysis program or the expert analysis program to provide environmental/operational context for the waveform and parameters for the rules. Plant control system data may be incorporated as vectors in a waveform model of a self-learned operating condition, for example by principle component analysis or support vector machine logic. A shaft rotational position or per-revolution pulse 29 may be input to establish phase relationships in the waveforms. Other examples of operational parameters that may be provided to the expert analysis program in addition to shaft voltage and shaft current include, but are not limited to the following:

Load (MW, HP, etc.)
Reactive load (MVAR, VAR, etc.)
Rotor excitation current
Rotor excitation voltage
Voltage regulator settings
Rotor winding temperature
Rotor temperature
Bearing temperatures (multiple bearings and locations)
Bearing vibration (multiple bearings and locations)
Ambient conditions
Partial discharge monitor output
Flux probe output signal
Local smoke detector outputs
High frequency shaft voltage/current activity evaluation
For 3 phase generators or motors:
Phase A stator current
Phase B stator current
Phase C stator current
Phase A stator voltage
Phase B stator voltage
Phase C stator voltage
Generator Condition Monitor output
Neutral ground current and voltage
For steam turbine shafts:
Steam flow to LP turbine
Steam temperature to LP turbine
Steam chemical analysis parameters
Temperatures and pressures Such data may be used by the expert analysis program to select model waveforms relevant to the current plant condition. Output of the expert analysis may include automatic plant interventions, operator alerts and status 32. At least some of the outputs may provide interventions for the rotating equipment that result in a change in operating behavior thereof. Fault and degradation findings may be fed back 33 into the self-learning logic as later described. The operator may provide additional inputs 34 to the plant control system responsive to the alerts and status information 32. The self-learning logic may communicate newly learned experience to and from a central database 36 accessible for example over the Internet by authorized systems.

Characteristics of the waveform may be computed over multiple shaft rotations—for example at least 4 or 8 shaft rotations—in order to resolve periodic aspects related to the shaft rotation rate. Other waveform characteristics may be computed over shorter and longer durations sufficient to resolve non-periodic signals including transient spikes and longer trends such as in the root mean square or peak mean, or for a behavior over time analysis that could span hours or years. Autocorrelation may be used for example to find periodic events that may be hidden by noise or other aspects of the signal. Analysis may include convolving or cross-correlating a predefined model wavelet with a real-time waveform of the grounding voltage or current to locate irregular or one-sided transients predictive of equipment degradation. Fourier or wavelet-based transforms, digital filters, or other means or combinations of those methods, may be used to model, analyze, and store the signal in a database and to identify correlations of the waveform to baseline and fault model wavelets and periodic waves. Alternately or additionally, statistical methods such as principal component analysis (PCA), support vector machine (SVM) modeling, or other mathematical methods may be used to identify such correlations. Thus potentially abnormal conditions are determined predictively.

These techniques can be used for analysis as well as data compression. The waveforms may be saved in their raw state in addition to the reduced data. A self-learning waveform analyzer may comprise a Support Vector Machine, which describes data by a series of vectors. Each vector is defined by elements comprised of statistical calculation results, which may include standard calculations like RMS, peak values, or standard deviation; operating data such as load, temperature, and any other parameters the system uses; and specific amplitudes at frequencies based on Fourier or wavelet transform, PCA analyses, or any other analysis technique. The expert system may use any of the above elements individually plus the output from the SVM to perform analysis that focuses on identification of the fault or operational issue.

Baseline waveforms may be characterized from a received signal of grounding or counteracting voltage or current, and saved as models in a database, for example after the equipment is optimally tuned and checked manually. The database may contain a self-learned family of expected waveforms, characterized and stored as models during normal operation. The term "family of expected waveforms" herein means a group of waveforms related to normal operation of the rotating equipment. A family of model waveforms may be provided for each sub-range of expected ambient conditions and plant loads.

Figure 2:
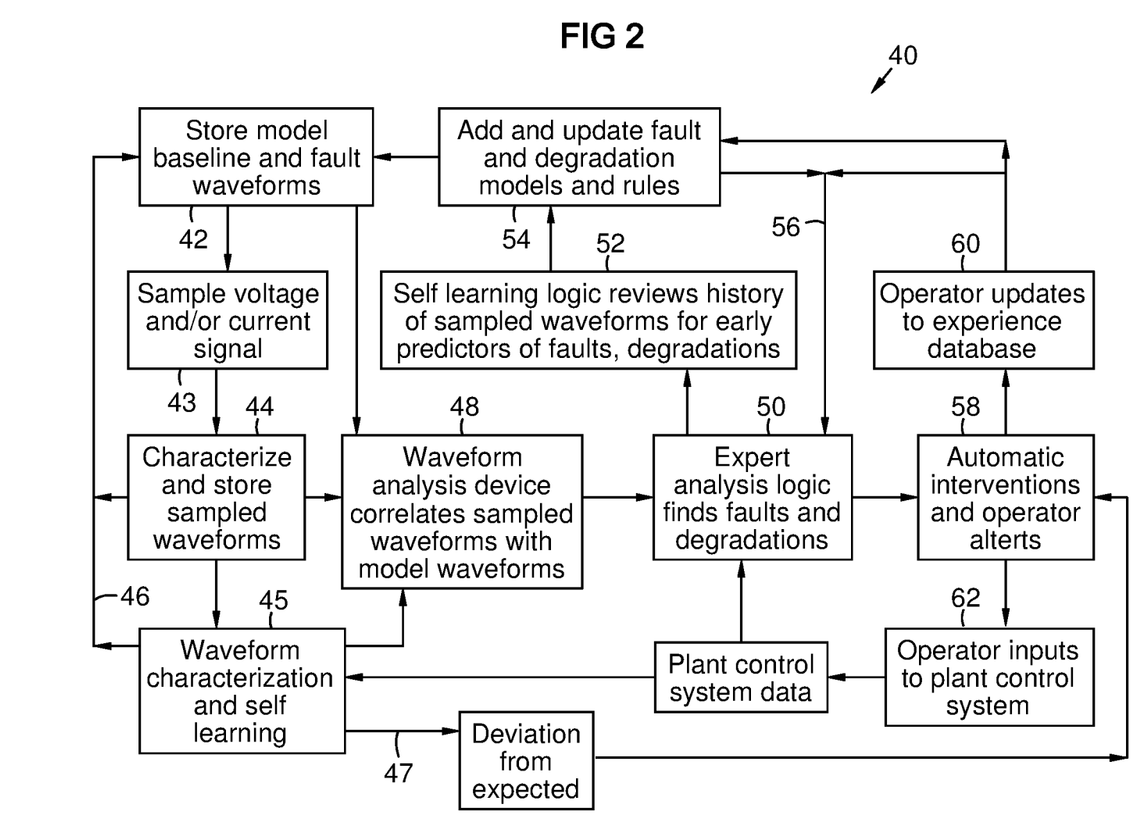
FIG. 2 illustrates a process of monitoring according to aspects of an embodiment.

FIG. 2 illustrates a process 40 according to an embodiment of the invention with the following exemplary steps:

42—Store model baseline waveforms and fault waveforms in a database for comparison with waveforms of voltage and/or current signals received from a grounding system of rotating equipment. Waveforms may be stored in models as previously described.

43—Sample shaft grounding and/or counteracting voltage and/or current signals.

44—Characterize waveforms of the sampled signals as models. Archive the models, and optionally the raw data of the signals, in the database along with time and date stamps.

45-46—Characterize waveforms representing present operation. Use waveform modeling to learn the characteristics of these waveforms. Characterize later signal waveforms for comparison with baseline waveforms. After maintenance of the rotating equipment or stationary equipment that can impact the shaft grounding parameters, a manual entry may be made by plant operators that indicates the maintenance work done and an expectation of normal operation. Store a family of waveforms representing post maintenance operation. If the family of waveforms does not match those of known malfunctions, they will be stored to define normal operation for the particular piece of equipment at that time. If the family of waveforms approximates a model of known malfunctions, especially those that occur during or after maintenance, the system will alert operators and/or perform another automatic intervention. The maintenance indicator may also be used to trend waveform changes over time for known degradation features.

The system may learn an expected waveform either with or without the plant operating condition information, and issue an alert of a change. This function may be independent of baseline and fault models that can be correlated to specific problems. An alert 47 in this case will not indicate what is wrong, but that the waveform has changed substantially from a prior waveform.

47—Alert operator to data falling outside a threshold envelope for a previously learned waveform.

48—Automatically correlate the sampled waveforms with the model waveforms.

50—Analyze the correlations via expert system logic to find faults and degradation events based on departures from baseline waveforms and based on similarities with fault and degradation waveforms in view of plant system data.

52—Automatically forward the found fault and degradation events to the self-learning logic. Review the archived sampled waveforms via the self-learning logic to find waveforms and trends thereof that are predictors of currently identified faults and degradations.

54—Update the fault and degradation models database with the newly found predictive waveforms.

56—Update a rules and thresholds database for the expert system logic for analyzing the newly found predictive waveforms and trends thereof. This may include updating or adding correlation thresholds and trend rate thresholds relative to newly identified predictive waveforms.

58—Provide an intervention for the rotating equipment based on the step of correlating when a sampled waveform indicates equipment behavior that deviates from an expected behavior represented by the model waveforms.

60—Enable operator updates to the model and experience databases, where the operator can provide human situational knowledge. This may include the maintenance information also described in step 45-46.

62—Provide operator inputs to the plant control system and system data.

Waveform references may be compared to learned behavior as well as fault analysis values either programmed into or learned by the expert system. Following are some sample diagnoses:

a) The shaft grounding brush is dirty and requires maintenance at a confidence level of 0.7, based for example on waveform analysis indicating steady high value or voltage buildup followed by periods of discharges.

b) A bearing pedestal ground is causing large circulating currents through the shaft and bearing at a confidence level of 0.34 based on waveform analysis indicating bursts of high current correlated with bursts of low voltage, with appropriate running speed components.

c) Shaft monitoring system is malfunctioning at a confidence level of 0.95 because waveform matches previous measurement failure scenarios.

Figure 3:
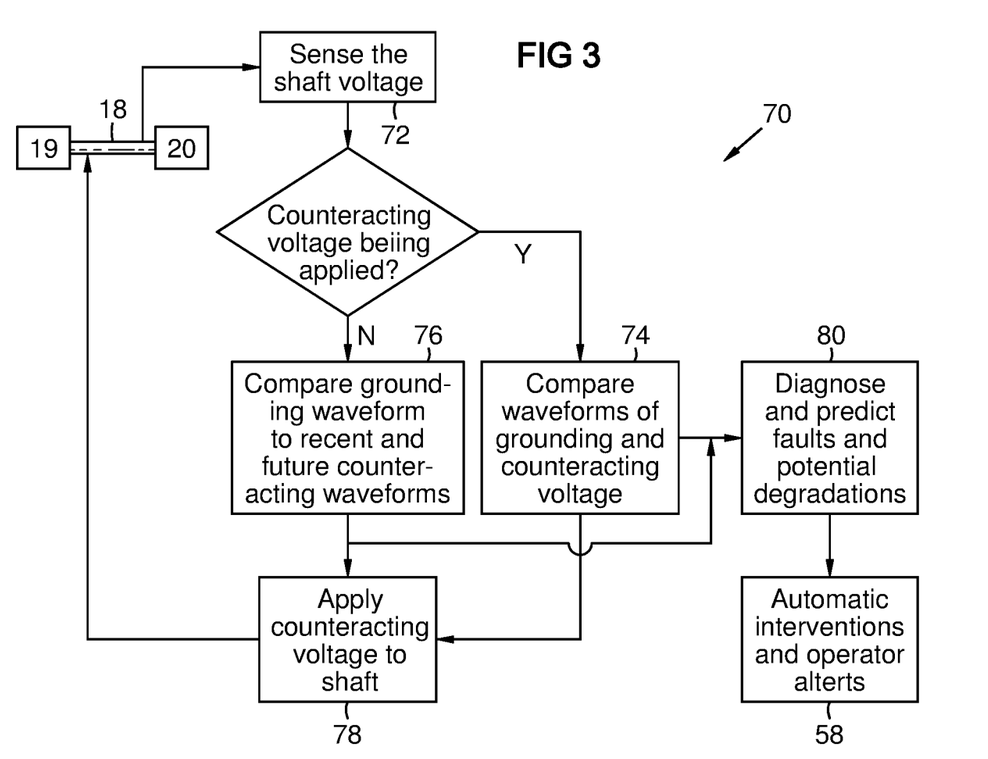
FIG. 3 illustrates a process of counteracting and diagnosing the shaft voltage according to a further embodiment.

FIG. 3 illustrates a process 70 of counteracting the shaft voltage in a system according to FIG. 1B. A counteracting voltage may be applied it to the shaft via a second brush or other device to neutralize or minimize the voltage on the shaft. A diagnostic element 39 of the system of FIG. 1B may simultaneously record and compare the shaft grounding voltage and the active counteracting voltage waveforms. For example the following steps may be used:

72—Sense the shaft voltage.

74—If a counteracting voltage is being applied, characterize and compare the waveforms of the shaft and counteracting voltage.

76—If a counteracting voltage is not being applied, record the shaft voltage and current waveforms, and compare to recent and future counteracting waveforms.

78—Apply counteracting voltage to the shaft.

80—Based on the comparison of steps 74 and 76, determine and predict faults and potential degradations.

58—Provide automatic interventions and operator alerts.

The system may periodically and automatically switch from active to passive mode, and for a short time on the order of seconds, capture the shaft waveform without any counteracting voltage applied (step 76). This mode is not implemented if the ongoing analysis of the counteractive voltage indicates that an excessive shaft voltage will result from removal of the active grounding function. The system may then shift from passive back to active mode, and immediately compare the recent passive waveform to the shaft voltage waveform with active counteracting voltage applied and to the counteracting voltage.

Generator or excitation problems will manifest themselves not only as a voltage on the shaft or current to ground, but also with a reaction time and/or behavior to the counteracting voltage waveform that is a characteristic of the inductance, capacitance, and the amount of charge that is stored in the rotor/generator system. In some cases the shaft voltage will nearly immediately respond to a counter voltage, but in other cases it may take longer. Certain features in the shaft voltage waveform and the counteracting voltage waveform may be identified and correlated, but may be offset in time, or undergo shape changes from expected shapes. The phase difference and feature shape characteristic differences may indicate specific malfunctions of the rotating equipment.

The system may continuously monitor and adjust the lead time for applying the counteracting waveform relative to the corresponding phase of the predicted continuing waveform to minimize the shaft voltage. It may compare the waveforms of the shaft voltage and the counteracting voltage, and determine the time offset between corresponding features thereof to adjust the lead time. It may further determine and predict faults and potential degradations in the rotating equipment based on the lead time and trends thereof.

In an embodiment with a counteracting voltage, the diagnostic comparison element 39 may analyze at least one or at least two of the following parameters to diagnose the condition of the rotating equipment, and optionally to facilitate continual adjustment of the counteracting voltage waveform:

a) the counteracting voltage waveform;
b) the grounding waveform with the counteracting voltage applied;
c) the grounding waveform without the counteracting voltage applied;
d) a waveform calculated as a mathematical difference between the grounding waveform and the counteracting voltage waveform with the counteracting voltage applied;
e) a waveform calculated as a mathematical difference between the grounding waveform and the counteracting voltage waveform with the counteracting voltage not applied;
f) a phase difference between specific corresponding features in the grounding waveform and the counteracting voltage waveform; and
g) a difference in waveform shape between the grounding waveform and the counteracting voltage waveform.

In the embodiment of FIG. 1B, the counteracting voltage may be produced by a standard electronics feedback system as previously described for example in U.S. Pat. No. 4,873,512. In the embodiment of FIG. 1C a counteracting voltage waveform may be calculated based on the above analyses and the system may continuously correct and improve the counteracting waveform by monitoring its effect on the grounding waveform. The system may further learn and store model counteracting waveforms and may analyze the current counteracting waveform by comparison to the model counteracting waveforms to determine and predict faults and potential degradations in the rotating equipment.

Figure 4:
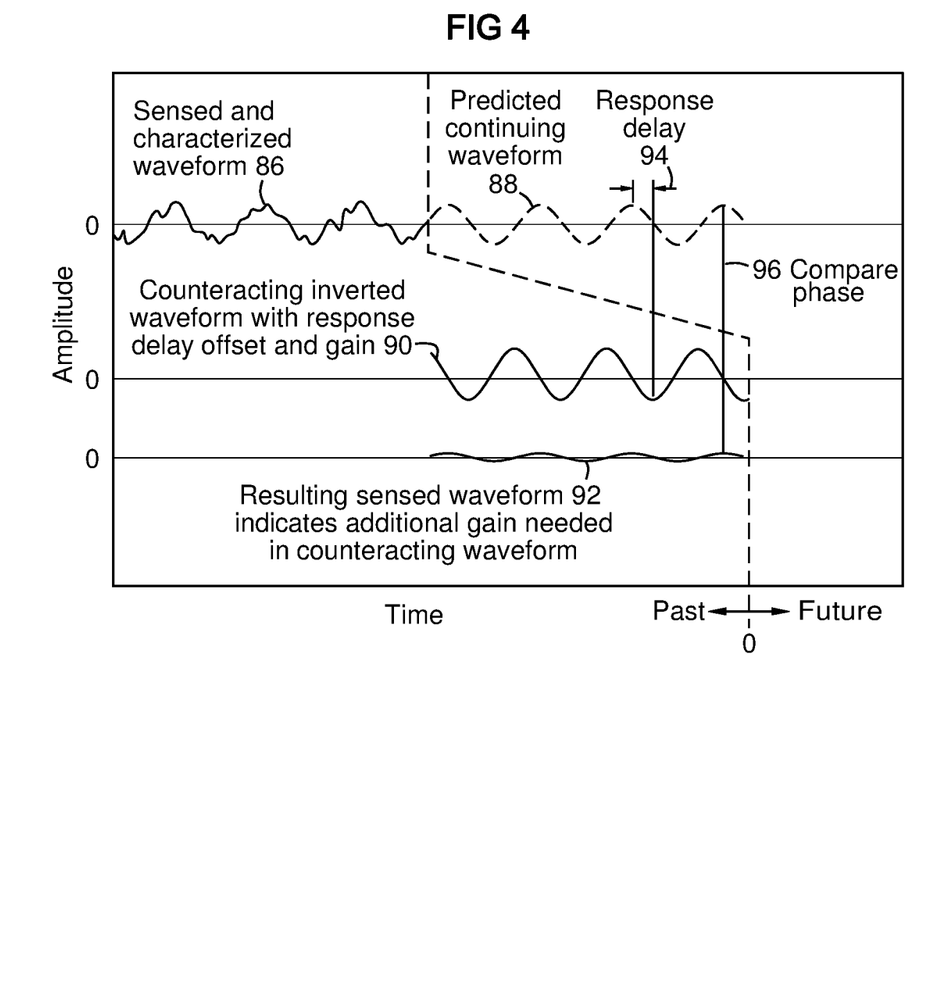
FIG. 4 illustrates grounding, counteracting, and resulting waveforms according to aspects of an embodiment the invention.

FIG. 4 illustrates a grounding waveform 86, a predicted waveform 88, a counteracting waveform 90, and a resulting waveform 92 according to aspects of an embodiment of the invention. The illustrated waveforms are simplified and conceptualized for clarity. For example the grounding waveform may be a noisy superposition of multiple periodic waves, including some with frequencies that are not integer multiples of a lower-frequency, plus non-periodic pulses or spikes. The predicted waveform 88 may be calculated as a continuation of one or more selected periodic aspects of the grounding waveform 86. The counteracting waveform may be applied ahead of the predicted waveform by an amount of a response delay 94. The counteracting voltage waveform results in a reduced shaft voltage waveform 92, which may then be analyzed for refinement of the counteracting waveform. For example, if the resulting waveform 92 is in phase 96 with the predicted continuing waveform 88, then the resulting waveform can be multiplied by the existing gain factor then subtracted from the counteracting waveform (prior to applying the delay offset) to adjust the gain of the counteracting waveform. If the resulting waveform 92 is out of phase with the predicted waveform, then the offset for response delay 94 may be adjusted.

Whether the counteracting voltage is calculated by program logic or is created by analog circuit components such as an op-amp, the reaction time or delay 94 between the application of the counteracting voltage and the associated response in the grounding voltage may provide an indication of particular problems. Thus, the counteracting voltage waveform may be compared to the grounding voltage waveform to find a time delay in the response. Analysis of this response delay may be used by the system to indicate a condition of the rotating equipment.

In an embodiment, the expert logic in the system may self-learn to predict certain non-periodic pulses or spikes in the grounding or counteracting waveforms based on changes in a waveform that consistently precede such pulses or spikes under particular operating conditions. Thus, the system may issue alerts and interventions in advance of such non-periodic events.

Figure 5:
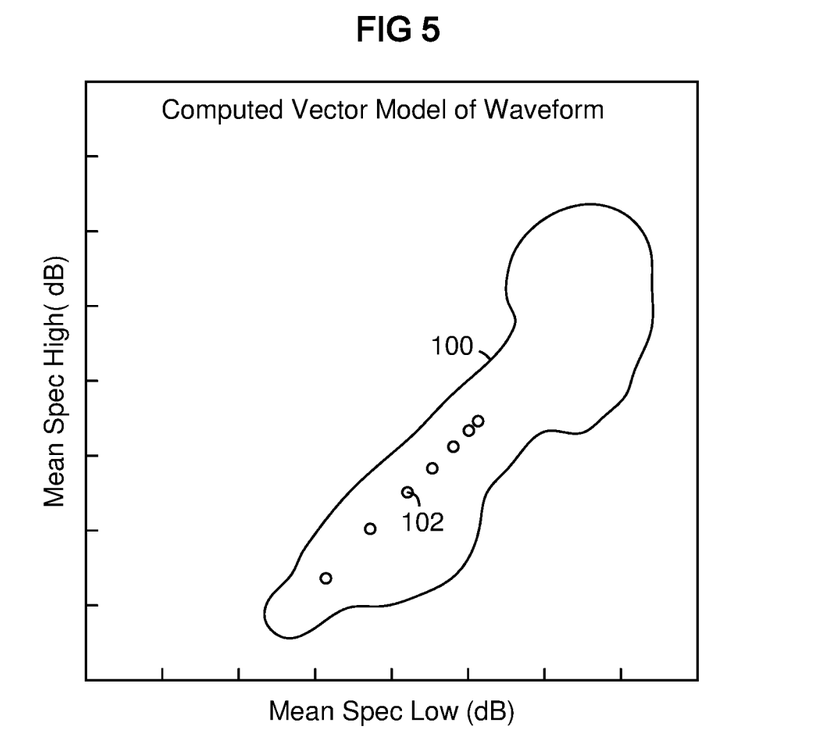
FIG. 5 illustrates a support vector machine output screen exemplifying a vector model of a waveform and a specification envelope.

FIG. 5 shows an output screen from a support vector machine, illustrating a vector model of a waveform and a specification limit envelope 100. Although this visualization is limited to two dimensions, the envelope may represent a slice from a multidimensional shape. The vector model and envelope may be learned by the present invention during normal operation of rotating equipment to serve as a baseline model in the learned family of expected waveforms. Additionally, such a vector model may be learned during a fault detection to serve as a fault model. Each dot 102 inside the envelope represents one vector. Plant configuration and operating parameters may be integrated into the model itself—for example as vectors in an SVM model, or in a PCA model, a neural network, or any other mathematical modeling method having a capacity for both waveform and environmental modeling in the same model. This provides more specific and nuanced modeling than using a predetermined matrix of expected ranges, and allows modeling of situations that occur outside the expected ranges of plant parameters. It provides more comprehensive analysis for early prediction of problems than an alarm limit based on a particular plant load or temperature. The model and envelope are specific for the rotating equipment installation on which the model is learned, making it highly discriminating to small or subtle differences in waveforms. However, the model may be copied and optionally modified, and the envelope may be enlarged to be used for alerts on a type class of the monitored equipment. For example, a learned model on one installation of a given type may be used during an initial learning period of the present invention on a newly installed or newly modified rotating equipment of the same type. The model may further be used with a much larger envelope for alerts on a more general class of equipment.

An installation of rotating equipment may create and store models of installation-specific expected waveforms of the signal based on characterizations of the signal waveform.

Each waveform model may comprise a specification envelope for the waveform under a given operating condition of the rotating equipment. A processor at the installation or elsewhere may create a set of modified models by enlarging the specification envelopes of the installation-specific models such that the enlarged specification envelopes apply more generally to a given machine model of the rotating equipment in a variety of installations. Further modified models may be created by further enlarging the specification envelopes such that they apply even more generally to a machine type of the rotating equipment. The waveform models, the modified models, and the further modified models may be provided to a database accessible to multiple plants for use by other machines of the given model or type of the rotating equipment. At least some of these other machines may then characterize signal waveforms and/or counteracting waveforms as described herein, and diagnose a fault or predicted problem if a component of a signal waveform falls outside one of the enlarged specification envelopes or further enlarged specification envelopes.

A repetition of recognized faults or other anomalies in a characterized waveform can provide diagnostic information in the number and pattern of repetitions of a fault in a given time period under given operating conditions. The present invention may analyze a pattern of repetitions of a fault that may normally be tolerable, to diagnose and predict an additional problem. For example, it may be acceptable for a certain known fault to occur at a given frequency under a known plant condition. However, the same fault occurring at a different frequency, or under different plant operating conditions, may indicate a serious or unknown condition that must be addressed. An operator may interpret repetitions of a known spurious fault as redundant information and thus insignificant. However, the present system may continually analyze repetition patterns of faults or other anomalies by statistically comparing a pattern of such anomalies against model patterns of repetitions of faults and anomalies that were stored in a database of the system by self-learning, interactive flagging by an operator, or from a central database.

Analyzing a repetitious pattern may involve a signal waveform with a series of anomalies such as drops or spikes or other abnormal departures or shape changes of the waveform. An example shown in FIG. 8 of U.S. Pat. No. 4,873,512 involves once-per-revolution dropouts from an average signal level. Analysis herein may include characterizing and analyzing the frequency of occurrence of the anomaly, or analyzing shape aspects of the anomaly, such as widths, end shapes, or angles of sides thereof. For example, a series of drop-outs with progressively increasing widths may be more significant than a similar series with constant widths. A series of anomalies of progressively increasing frequency of occurrence may be more significant than a series of similar anomalies of constant frequency. Analysis may further include analyzing changes in a shape aspect in successive drops or spikes in the series. Analysis may be performed on grounding voltage or current and/or on counteracting voltage or current. Anomalies that are within an acceptable amplitude threshold, and are therefore not considered faults may nonetheless be included in such analysis.

The invention enables continuous and automated diagnostics of shaft voltage and drain current waveforms. It can rival or surpass human experts in the analysis task, and surpass human experts with the ability to do the analysis continuously and in real time, including self-learning regarding the waveforms and trends of the relevant operational parameters compared to previous trend data. In the embodiment with active counteracting voltage and constant self-learning and self-correction, it can minimize the shaft voltage more effectively than has been possible in prior systems.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A method for operating a shaft grounding system comprising:
   recording a voltage signal associated with a shaft of a rotating equipment by a voltage sensor;
   characterizing a grounding waveform of said voltage signal over time by a processor;
   comparing a shape aspect of the grounding waveform to a shape aspect of a baseline waveform model and a shape aspect of a fault waveform model by the processor, wherein the baseline waveform model comprises a group of expected waveforms related to a normal operation of the rotating equipment, and wherein the fault waveform model comprises waveforms related to fault and degradation conditions of the rotating equipment;
   analyzing the grounding waveform to find faults and degradation events of the rotating equipment based on similarities with the fault waveform model by the processor;
   diagnosing a condition of the rotating equipment by the processor when the grounding waveform indicates a behavior of the rotating equipment that deviates from the baseline waveform model based on the comparison;
   wherein the diagnosing step further comprises:
      predicting a continuing waveform of a grounding voltage of the shaft based on periodic aspects thereof,
      determining a counteracting waveform for a counteracting voltage that will minimize the predicted continuing waveform of the grounding voltage;
      applying the counteracting waveform of the counteracting voltage to the predicted continuing waveform of the grounding voltage of the shaft; and
      diagnosing the condition of the rotating equipment by analyzing characterized waveforms of the counteracting voltage and the grounding voltage;
   wherein the diagnosis comprises a malfunction of a shaft grounding brush, a malfunction of a bearing pedestal ground, or a malfunction of a shaft monitoring system,
   changing the behavior of the rotating equipment that deviates from the baseline waveform model based on the diagnosis;
   outputting an alert for the rotating equipment by the processor based on the diagnosis; and
   applying a counteracting voltage to the shaft to minimize the grounding voltage of the shaft of the rotating equipment based on the diagnosis.

2. The method of claim 1, further comprising:
   identifying a repeating pattern of faults indicated by the grounding waveform;
   comparing the repeating pattern to a predictive fault repetition pattern stored in a database to determine the condition of the rotating equipment.

3. The method of claim 1, further comprising:
   identifying and characterizing a series of repeating anomalies in the grounding waveform; and diagnosing the condition of the rotating equipment based on at least one of a shape aspect, progressive shape changes, and a frequency of occurrence of the anomalies of the series.

4. The method of claim 1, further comprising:
self-learning characteristics of the grounding waveform that statistically precede a non-periodic anomaly in the grounding waveform; and
diagnosing the condition of the rotating equipment responsive to a prediction of the non-periodic anomaly based on the step of self-learning.

5. The method of claim 1, further comprising:
collecting voltage signal as a time series of grounding voltage at a sample rate of at least 2 kHz; and
characterizing the time series by at least one of a wavelet transform, a Fourier transform, a principal component analysis, a neural network, and a support vector machine algorithm; and
correlating the characterized time series with the baseline waveform model and the fault waveform model to diagnose the condition of the rotating equipment.

6. The method of claim 1, further comprising:
creating and storing a plurality of baseline waveform models in a database that characterize acceptable baseline conditions of the rotating equipment;
creating and storing a plurality of fault waveform models in the database that characterize degraded or fault conditions of the rotating equipment;
creating a grounding waveform model that characterizes the grounding waveform;
integrating operational parameters of the rotating equipment under given operating conditions thereof directly into the grounding waveform model, the baseline waveform models, and the fault waveform models; and
correlating the grounding waveform model to at least one of a baseline waveform models and a fault waveform model from the database to diagnose the condition of the rotating equipment.

7. The method of claim 1, further comprising:
creating and storing a plurality of baseline waveform models in a database that characterize acceptable baseline waveforms for respective sub-ranges of operating conditions of the rotating equipment;
creating and storing a plurality of fault waveform models in the database that characterize waveforms of degraded or fault conditions for the respective sub-ranges of operating conditions of the rotating equipment;
inputting operational data related to the rotating equipment; and
selecting a waveform model from the database based on the operational data, and comparing the selected waveform model to a model of the grounding waveform to diagnose the condition of the rotating equipment.

8. The method of claim 7, further comprising:
identifying faults and degradations in the rotating equipment by executing expert system logic that uses at least one of a Fourier transform, a wavelet transform, a principle component analysis, a neural network, and a support vector machine to model and compare the grounding waveform to the selected waveform model in view of the operational data;
archiving the models of the grounding waveforms over time;
analyzing changes in the archived grounding waveforms that precede fault and degradation events identified by the expert system logic; and providing self-learning by automatically updating the fault waveform models in the database and updating the expert system logic, or parameters thereof, to provide a prediction of future faults and degradations based on recognition of the precedent changes in the archived grounding waveforms.

9. The method of claim 1, further comprising:
creating and storing models of expected waveforms of voltage signal during well-tuned operations of the rotating equipment based on the characterization of the grounding waveform after a manual tuning and verification thereof;
incorporating operational parameters of the rotating equipment directly into the models of the expected waveforms, wherein each said model of an expected waveform provides a specification envelope for an acceptable waveform under a given operating condition; and
modeling grounding waveforms of the rotating equipment, and indicating a fault or predicted problem if a component of a grounding waveform model falls outside the specification envelope of an expected waveform model under the given operating condition.

10. The method of claim 1, further comprising:
creating and storing installation-specific models of expected waveforms of voltage signal based on the characterization of the grounding waveform, each said installation-specific model comprising a specification envelope for a waveform under a given operating condition of the rotating equipment at a given installation;
creating a set of modified models by enlarging the specification envelopes of the installation-specific models, wherein the enlarged specification envelopes apply to a given machine model of the rotating equipment for a range of installations;
creating a set of further modified models by further enlarging the specification envelopes of the installation-specific models, wherein the further enlarged specification envelopes apply to a machine type of the rotating equipment including plural models thereof;
providing the modified models and the further modified models to a database accessible to multiple installations of machines of the machine type of the rotating equipment; and
indicating a fault or predicted problem if a characteristic of a grounding waveform of the machine falls outside one of the enlarged specification envelopes or one of the further enlarged specification envelopes.

11. The method of claim 1, further comprising:
creating and storing models of expected waveforms of voltage signal, wherein each said model comprises an installation-specific specification envelope for characteristics of voltage signal in a given installation of the rotating equipment;
creating machine model specification envelopes for the expected waveform models by enlarging the installation-specific specification envelopes to create machine model specification envelopes that apply to a given machine model of the rotating equipment for a range of installations thereof;
creating machine type specification envelopes for the expected waveform models by further enlarging the installation-specific specification envelopes to create machine type specification envelopes that apply to a given machine type of the rotating equipment for a range of machine models thereof;

providing the expected waveform models, the machine model specification envelopes thereof, and the machine type specification envelopes thereof to a database; and modeling grounding waveforms in an additional rotating equipment of the given machine type to diagnose a condition of the additional rotating equipment.

12. The method of claim 1, further comprising:

determining a response delay between the application of the counteracting voltage and a respective reduction in the grounding voltage by comparing characteristics of the counteracting voltage to corresponding response characteristics of the grounding voltage; and analyzing the response delay to diagnose the condition of the rotating equipment.

13. The method of claim 1, further comprising analyzing at least one of the following parameters to diagnose the condition of the rotating equipment:
  a) a waveform calculated as a mathematical difference between the continuing waveform of the grounding voltage and the counteracting waveform of the counteracting voltage with the counteracting waveform of the counteracting voltage applied;
  b) a waveform calculated as a mathematical difference between the continuing waveform of the grounding voltage and the counteracting waveform of the counteracting voltage with the counteracting waveform of the counteracting voltage not applied;
  c) a phase difference between specific corresponding features in the continuing waveform of the grounding voltage and the counteracting waveform of the counteracting voltage; and
  d) a difference in waveform shape between the continuing waveform of the grounding voltage and the counteracting waveform of the counteracting voltage.

14. The method of claim 1, further comprising analyzing at least two of the following parameters to diagnose the condition of the rotating equipment:
  a) a waveform calculated as a mathematical difference between the continuing waveform of the grounding voltage and the counteracting waveform of the counteracting voltage with the counteracting waveform of the counteracting voltage applied;
  b) a waveform calculated as a mathematical difference between the continuing waveform of the grounding voltage and the counteracting waveform of the counteracting voltage with the counteracting waveform of the counteracting voltage not applied;
  c) a phase difference between specific corresponding features in the continuing waveform of the grounding voltage and the counteracting waveform of the counteracting voltage; and
  d) a difference in waveform shape between the continuing waveform of the grounding voltage and the counteracting waveform of the counteracting voltage.

* * * * *